United States Patent [19]
Thomsen et al.

[11] Patent Number: 5,991,196
[45] Date of Patent: Nov. 23, 1999

[54] REPROGRAMMABLE MEMORY DEVICE WITH VARIABLE PAGE SIZE

[75] Inventors: Joseph A. Thomsen; Timothy J. Phoenix, both of Gilbert; Brian Boles, Mesa; Henry Pena, Chandler; Gordon E. Luke, Mesa, all of Ariz.

[73] Assignee: Microchip Technology Incorporated, Chandler, Ark.

[21] Appl. No.: 08/991,423

[22] Filed: Dec. 16, 1997

[51] Int. Cl.$^6$ .................................................. G11C 16/04
[52] U.S. Cl. ............................... 365/185.11; 365/185.29; 365/230.06
[58] Field of Search .................. 365/185.11, 185.29, 365/189.05, 189.07, 201, 203, 230.06

[56] References Cited

U.S. PATENT DOCUMENTS

| | | | |
|---|---|---|---|
| 5,297,096 | 3/1994 | Terada et al. | 365/189.07 |
| 5,347,486 | 9/1994 | Urai | 365/189.05 |
| 5,428,580 | 6/1995 | Kawashima et al. | 365/201 |
| 5,600,601 | 2/1997 | Murakami et al. | 365/203 |

*Primary Examiner*—David Nelms
*Assistant Examiner*—David Lam
*Attorney, Agent, or Firm*—Paul Katz; Ronald Chichester Frohwitter

[57] ABSTRACT

An improved reprogrammable memory device permits definition of a page within an array of memory cells which is variable in size, erasure of only that data contained within the defined variable page while uneffecting the remaining data in the array of memory cells and reprogramming the defined variable page. The improved reprogrammable memory device with variable page size comprises an array of memory cells where the memory cells are arranged in rows and columns; address decode logic coupled to the array of memory cells for accessing the array of memory cells; amplifier logic coupled to the array of memory cells for amplifying the voltage levels between a plurality of the memory cells and data bus when accessing the array of memory cells; column select logic coupled to the array of memory cells for determining which word from a selected row of the array of the memory cells is accessed and for connecting the plurality of memory cells to the amplifier logic; control signals coupled to the amplifier logic for accessing the array of memory cells; and, block enable signals coupled to the address decode logic for varying page size within the array of memory cells to be erased.

17 Claims, 4 Drawing Sheets

VARIABLE PAGE ERASURE

REPROGRAMMABLE MEMORY DEVICE WITH VARIABLE PAGE SIZE

BACKGROUND OF THE INVENTION

1. Field of the Invention

This invention relates generally to reprogrammable memory devices and specifically to microcontrollers (hereinafter MCU) with internal electrically erasable programmable read only memory devices. This invention allows the improved reprogrammable memory device to define a page within an array of memory cells which is variable in size, erase only that data contained within the defined variable page while uneffecting the remaining data in the array of memory cells and then write new data to the defined variable page.

2. Description of the Prior Art

The current state of the art describes two types of reprogrammable memory devices for the purpose of erasing and writing to a program memory device. The first and traditional type of reprogrammable memory device may erase and write to the least addressable program memory location within an array of memory cells. The least addressable program memory location is typically defined as a word. Thus, the page size for this type of device is a word. To erase and program X number of pages, the reprogrammable memory device must execute X number of erase/write commands. The result of this technology is an independent erase and write cycle for each page of memory and is therefore a time consuming process.

The second type of reprogrammable memory device described by prior art defines a page as the entire physical contents of the program memory accessible by the MCU. Thus, the reprogrammable memory device sends a single erase command that erases the entire contents of the program memory. Each program memory word is subsequently reprogrammed by an independent write command. Devices that fall in this second category of reprogrammable memory devices are typically referred to as flash memory devices. While flash memory devices offer the benefit of reducing the time consumed in reprogramming the entire physical program memory over the traditional reprogrammable memory device, they suffer the detriment of an all or nothing approach. That is, flash memory devices are not capable of erasing and writing to selective addresses of program memory, but instead erase the entire physical program memory and require the rewriting of the entire program memory.

A recent development has employed flash memory in blocks at the chip level. That is, rather than having one large flash memory, there may be several smaller blocks of flash memory which allow the MCU to selectively erase and rewrite on a block by block basis. However, even with block flash memory, the MCU is not capable of subdividing individual blocks for erasure and rewriting nor is the MCU capable of word selective erasure as with the traditional reprogrammable memory device.

Finally, under prior art, semiconductor manufacturers have included both traditional reprogrammable memory and flash memory on the same device. However, this implementation requires the physical presence of both traditional reprogrammable memory device and flash memory. The result of this application are two separate program memories each controlled according to their respective technology. Thus, there exists a need for an improved reprogrammable memory device with variable page size because under prior art reprogrammable memory devices permit only the selective erase and write of the least addressable program memory location or bulk erase and write of the entire program memory.

SUMMARY OF THE INVENTION

In accordance with one embodiment of the present invention, it is an object of the present invention to provide an improved reprogrammable memory device that is capable of both bulk and selective erase of a single physical array of memory cells.

It is another object of the present invention to provide an improved reprogrammable memory device that is capable of specifying a variable memory page size within the array of memory cells for the purpose of erasing data.

It is a another object of the present invention to provide an improved reprogrammable memory device that permits variable memory page sizing and may be implemented in devices other than a reprogrammable memory microcontroller which include but are not limited to microprocessors, digital signal processors and other forms of electronic logic.

It is a further object of the present invention to provide an improved reprogrammable memory device that permits variable memory page sizing that is inexpensive to manufacture and reliable in operation, thus making the improved reprogrammable memory device economically viable to the average consumer.

BRIEF DESCRIPTION OF THE PREFERRED EMBODIMENTS

In accordance with one embodiment of the present invention a reprogrammable memory device is disclosed comprising an array of memory cells where the memory cells are arranged in rows and columns; address decode logic coupled to the array of memory cells for accessing the array of memory cells; amplifier logic coupled to the array of memory cells for amplifying the voltage levels between a plurality of the memory cells and data bus when accessing the array of memory cells; column select logic coupled to the array of memory cells for determining which word from a selected row of the array of the memory cells is accessed and for connecting the plurality of memory cells to the amplifier logic; control signals coupled to the amplifier logic for accessing the array of memory cells; and, block enable signals coupled to the address decode logic for varying page size within the array of memory cells to be erased.

In accordance with another embodiment of the present invention, the improved reprogrammable memory device is capable of two modes of operation for the same program memory space. In the first mode, the reprogrammable memory device will erase and write to the least addressable program memory location within an array of memory cells. In the second mode, the reprogrammable memory device will assert a single erase command that will erase the entire contents of the array of memory cells. Thus, in this embodiment of the present invention, the improved reprogrammable memory device incorporates the capabilities of the traditional reprogrammable memory device and the flash memory device over one physical array of program memory cells into an improved reprogrammable memory device.

In accordance with another embodiment of the present invention, the improved reprogrammable memory device is capable of variable page size program memory erasure. That is, the improved reprogrammable memory device may define a page that is greater than a single word of program memory, but smaller than the physical limit of the array of memory cells. In this embodiment the improved reprogrammable memory device will send a single erase command to the variable page program memory. Thus, the program memory contents of the variable page defined by the reprogrammable memory device will be erased by this single command.

In accordance with another embodiment of the present invention, the improved reprogrammable memory device is capable of three modes of operation over a single program memory space. These modes are described above as the single word erasure mode found in traditional reprogrammable memory devices, the bulk erasure mode found in flash memory devices and the variable page size erasure mode described in the preceding embodiments.

The foregoing and other objects, features, and advantages of the invention will be apparent from the following, more particular, description of the preferred embodiments of the invention, as illustrated in the accompanying drawings.

DETAILED DESCRIPTION OF THE PREFERRED EMBODIMENT

Figure 1:
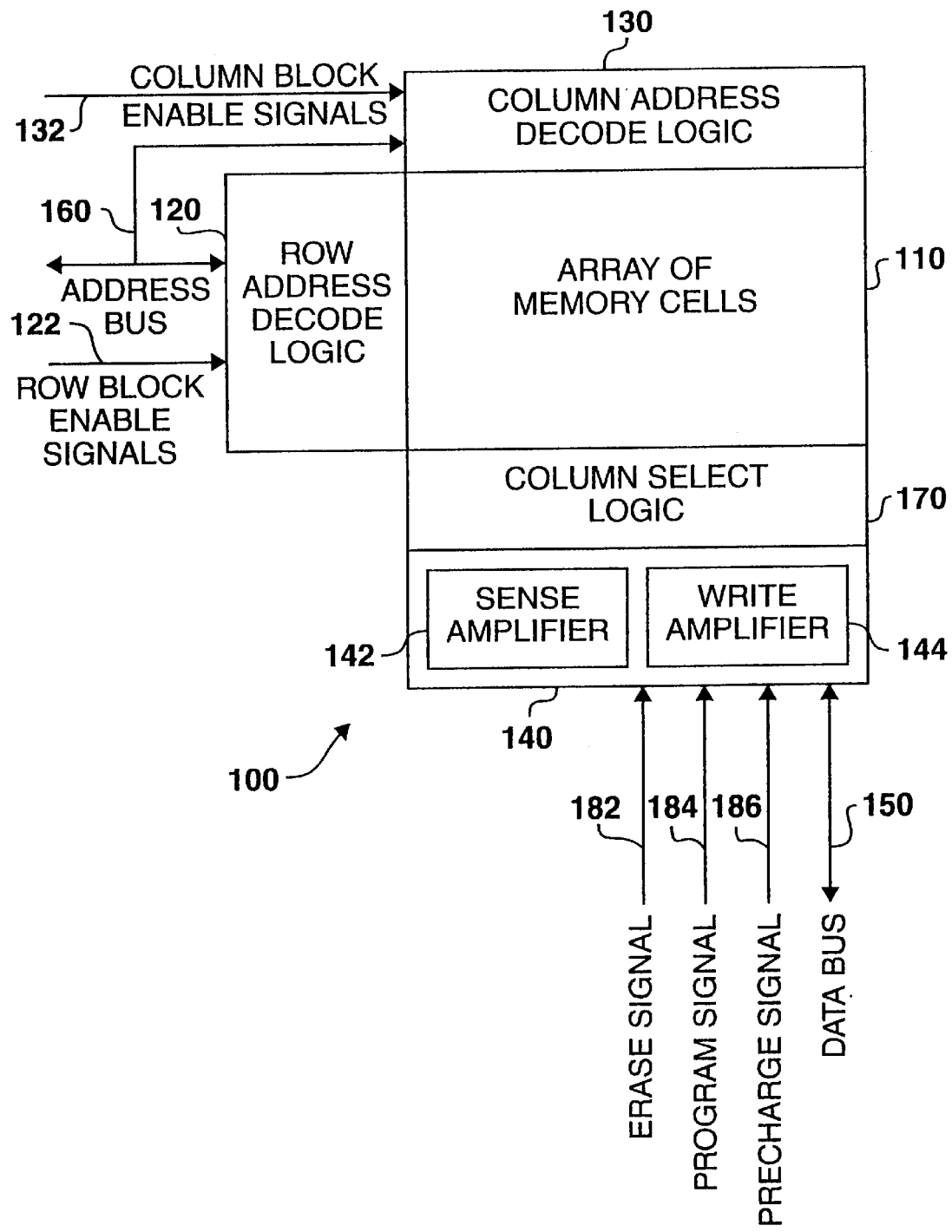
FIG. 1 is block diagram of the present invention.

Referring to FIG. 1, a reprogrammable memory device with variable page size 100 is shown. The device 100 is comprised of an array of memory cells 110 which are arranged in matrix format, i.e. rows and columns. In one embodiment of the invention the array of memory cells 110 is comprised of 14336 individual cells. The matrix of this embodiment is 224 memory cell columns and 64 memory cell rows. Each row contains 16 memory words, where each word is 14 memory cells (bits) long. Thus, there are 1024 addressable words which form a 64×16 matrix in the described embodiment. The invention is not limited to the size of the array of memory cells, memory geometry or word length described above.

The conventional technology for the array of memory cells is electrically erasable program read only memory (EEPROM). However, the invention is not limited to EEPROM technology.

Row decode logic 120 and column decode logic 130 are coupled to the array of memory cells 110. The function of the row 120 and column decode logic 130 is to decode the address bus 160 and to access a specific memory location, as is well known in the art. In the embodiment described above as 14336 memory cells, there are 64 addressable rows and 16 addressable columns.

Amplifier logic 140 is coupled to the array of memory cells 110 for the purpose of amplifying the voltage levels between the array of memory cells 110 and the data bus 150. The array of memory cells 110 and the data bus 150 operate in different voltage ranges. The amplifier logic 140 provides a solution for converting the voltage levels of the array of memory cells 110 to compatible voltage levels for the data bus 150 for the same respective logic level and vice versa. The plurality of sense amplifiers 142 convert the output voltage level of the array of memory cells 110 to the voltage level compatible with the data bus 150 during a memory read operation.

The plurality of write amplifiers 144 serve two functions. First, the write amplifiers 144 drive the addressed array of memory cells 110 to a voltage level compatible with logic level 0 during a memory erase operation. Second, the write amplifiers 144 convert the input voltage level of the data bus 150 to be compatible with the voltage level required by the array of memory cells 110 during a memory write operation. In the embodiment described above where the word length is 14 bits, there are 14 independent sense amplifiers 142 and 14 independent write amplifiers 144. However, the invention is not limited to these numbers of sense or write amplifiers.

The column select logic 170 reads the address bus 160 decoded by the column address decode logic 130 and connects either the sense amplifiers 142 or the write amplifiers 144 to the columns of the respective memory cells 110 depending on the type of memory access. Thus, the column select logic 170 forms a bridge between the array of memory cells 110 that is defined by the decoded column address and the amplifier logic 140.

The control signals 182–186 determine the type of memory access cycle. Asserting the erase signal 182 will enable erasure of the contents of the identified memory location(s) within the array of memory cells 110. Asserting the program signal 184 will enable writing of the contents of the data bus to the addressed location within the array of memory cells 110. De-asserting the precharge signal 186 to logic level 0 will enable reading the contents of the addressed location within the array of memory cells 110 and transferring those contents to the data bus 150. The precharge signal 186 is defined as an active low signal for memory read in the preferred embodiment, but the invention is not limited to this logic assignment.

The row 122 and column 132 block enable signals are coupled to the row 120 and column 130 address decode logic, respectively. The row 122 and column 132 block enable signals permit erasure of a variable page size within the array of memory cells 110 by forcing to logic level 1 (or alternatively by inhibiting to logic level 0) one or more bits of the row 120 and column 130 address decode logic. The row 122 and column 132 block enable signals are defined as active low signals in the preferred embodiment, but the invention is not limited to this logic assignment.

The row block enable signals 122 are coupled to the row address decode logic 120. Asserting a specific combination of the row block enable signals 122 when performing an erase cycle will select either: (1) a single row of the array of memory cells 110; (2) all rows of the array of memory cells 110 simultaneously; or (3) a plurality of rows of the array of memory cells 110 simultaneously wherein the plurality of rows is less than the full compliment of rows of the array of memory cells 110.

The column enable signals 132 are coupled to the column decode logic 130. Asserting a specific combination of the column block enable signals 132 when performing an erase cycle will select either: (1) a single column of the array of memory cells 110; (2) all columns of the array of memory cells 110 simultaneously; or (3) a plurality of columns of the array of memory cells 110 simultaneously wherein the plurality of columns is less than the full compliment of columns of the array of memory cells 110. Thus, coordinating the assertion of row 122 and column 132 block enable signals permits erasure in one cycle of a variable page size within the array of memory cells 110 that ranges in size from a single addressable memory location to the entire array of memory cells 110.

Figure 2:
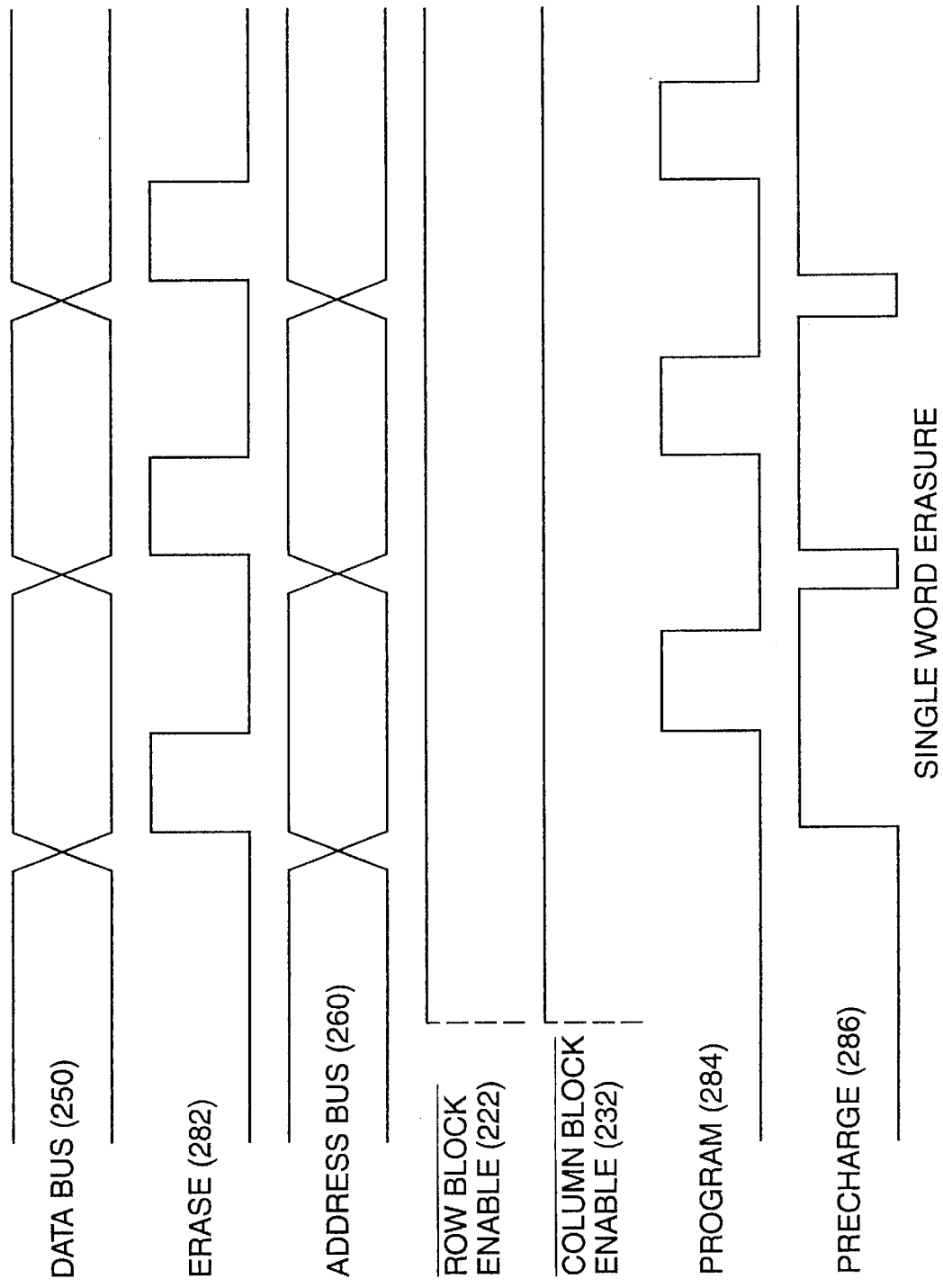
FIG. 2 is a relative timing control signal diagram of single word erasure.

FIG. 2 describes the operation of the reprogrammable memory device 100 of FIG. 1 for erasing one addressable memory location of the array of memory cells 110, FIG. 1 by performing a single erase cycle. With the address bus 260 stable and the row 222 and column 232 block enable signals at logic level one, the erase signal 282 and the precharge signal 286 are driven to logic level one near simultaneously. The contents of the memory word at the address location on the address bus 260 are erased. The erase signal 282 goes to logic level zero and the program signal 284 goes to logic level one near simultaneously, which marks the end of the memory erase cycle and the beginning of the memory write cycle.

With the program signal 284 asserted, the write amplifiers 144 are enabled and the contents of the data bus 250 are written into the addressed memory location. The write cycle completes when the program signal 284 and the precharge signal 286 go to logic level zero. This cycle is repeated for erasing and writing to each addressable memory word in the array of memory cells 110.

Figure 3:
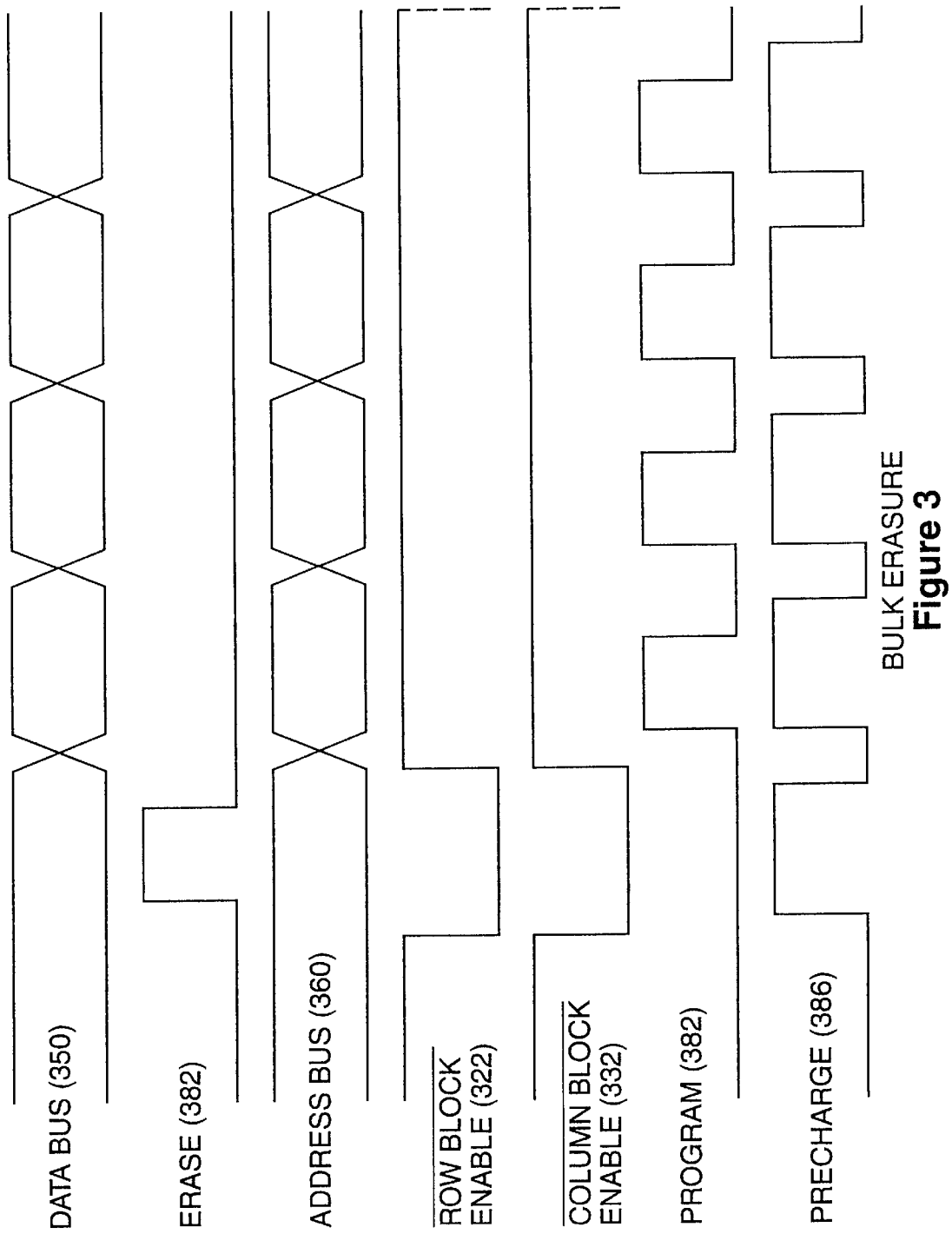
FIG. 3 is a relative timing control signal diagram of bulk erasure.

FIG. 3 describes the operation of the reprogrammable memory device 100 of FIG. 1 when erasing the entire array of memory cells 110, FIG. 1 simultaneously in a single erase cycle. With the address bus 360 stable and the row 322 and column 332 block enable signals at logic level zero, the erase signal 382 and the precharge signal 386 are driven to logic level one near simultaneously. The entire contents of the array of memory cells 110 are erased. The erase signal 382 and the precharge signal 386 go to logic level zero and the row 322 and column 332 block enable go to logic level one to complete the erase cycle.

With the program signal 384 asserted and the precharge signal 386 at logic level one, the write amplifiers 144 are enabled and the contents of the data bus 350 are written into the addressed memory location. The program signal 384 and the precharge signal 386 revert to logic level zero while a new address is posted on the address bus 360 and a new data word is posted on the data bus 350. This write cycle is repeated for writing to each addressable memory word in the array of memory cells 110.

Figure 4:
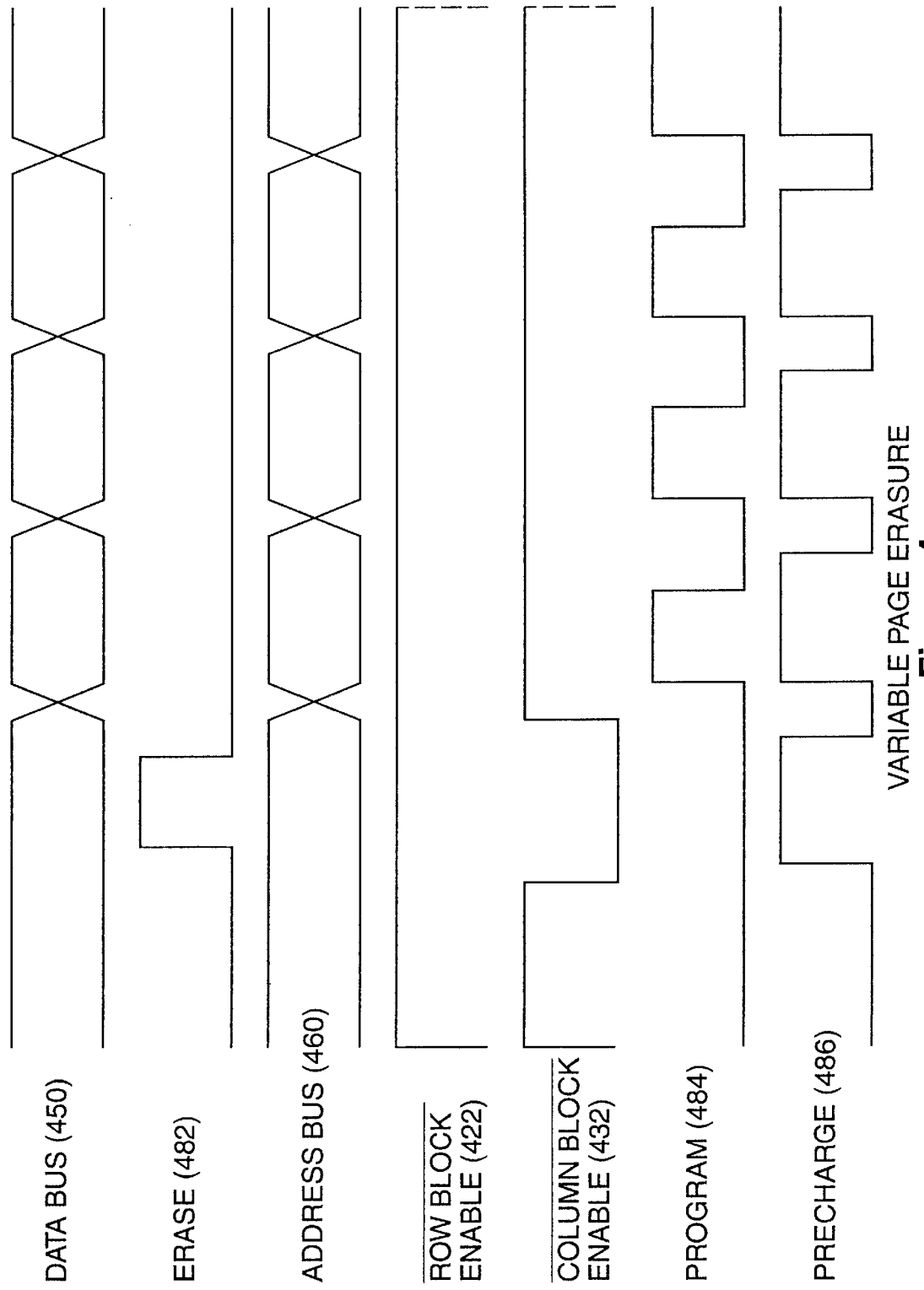
FIG. 4 is a relative timing control signal diagram of variable page erasure.

FIG. 4 describes the operation of the reprogrammable memory device 100 of FIG. 1 when erasing a plurality of rows and column memory locations within of the array of memory cells 110, FIG. 1 simultaneously, in a single erase cycle, wherein the plurality of row and column memory locations is less than the entire array of memory cells 110, FIG. 1. With the address bus 460 stable and the row block enable signal 422 at logic level one and column block enable signal 432 at logic level zero, the erase signal 482 and the precharge signal 486 are driven to logic level one near simultaneously. The contents of the addressed row of memory cells (16 memory words) are erased. The erase signal 482 and precharge signal 486 go to logic level zero and the column block enable signal 432 goes to logic level one to complete the erase cycle.

With the program signal 484 asserted and the precharge signal 486 at logic level one, the write amplifiers 144 are enabled and the contents of the data bus 450 are written into the addressed memory location. The program signal 484 and the precharge signal 486 revert to logic level zero while a new address is posted on the address bus 460 and a new data word is posted on the data bus 450. This write cycle is repeated for writing to each addressable memory word in the memory row.

In this embodiment, a single row block enable and single column block enable are disclosed. However, the claimed invention includes multiple row and column block enable signals to permit greater flexibility in varying the page size of the array of memory cells 110.

The row block enable (x22), column block enable (x32), data bus (x50), address bus (x60), erase (x82), program (x84) and precharge (x86) signals are the same respective signals for each figure. The most significant digit of the numerical label (x) reflects the number of the figure.

Although the invention has been particularly shown and described with reference to a preferred embodiment thereof, it will be understood by those skilled in the art that changes in form and detail may be made therein without departing from the spirit and scope of the invention.

What is claimed is:

1. A reprogrammable memory device comprising, in combination:

an array of memory cells wherein the memory cells are arranged in rows and columns;

address decode logic coupled to the array of memory cells for accessing the array of memory cells;

amplifier logic coupled to the array of memory cells for amplifying the voltage levels between a plurality of the memory cells and data bus when accessing the array of memory cells;

column select logic coupled to the array of memory cells for determining which word from a selected row of the array of the memory cells is accessed and for connecting the plurality of memory cells to the amplifier logic;

control signals coupled to the amplifier logic for accessing the array of memory cells; and block enable signals coupled to the address decode logic for varying page size within the array of memory cells to be erased.

2. The array of memory cells in accordance with claim 1 wherein the array of memory cells is an electrically erasable program read only memory (EEPROM).

3. The address decode logic, in accordance with claim 1 wherein the address decode logic comprises:

row address decode logic coupled to the array of memory cells for accessing an address specific row within the array of memory cells wherein each row comprising a plurality of memory words; and column address decode logic coupled to the array of memory cells for accessing an address specific column within the array of memory cells wherein each column comprising a plurality of memory words.

4. The amplifier logic in accordance with claim 1 wherein the amplifier logic comprises:

a plurality of sense amplifiers for converting an output of the array of memory cells to voltage levels compatible with the data bus; and a plurality of write amplifiers for erasing the array of memory cells and for converting an input of the data bus to voltage levels compatible with reprogramming the array of memory cells.

5. The control signals in accordance with claim 1 wherein the control signals comprise:

an erase signal for enabling the plurality of write amplifiers and erasing the array of memory cells;

a program signal for enabling the plurality of write amplifiers and reprogramming the array of memory cells; and a precharge signal for enabling the plurality of sense amplifiers and reading the array of memory cells.

6. The block enable signals in accordance with claim 1 wherein the block enable signals comprise:

row block enable signals; and column block enable signals.

7. The row block enable signals in accordance with claim 6, wherein the row block enable signals select one row of the array of memory cells when performing an erase cycle.

8. The row block enable signals in accordance with claim 6 wherein the row block enable signals select all rows of the array of memory cells simultaneously when performing an erase cycle.

9. The row block enable signals in accordance with claim 6, wherein the row block enable signals select a plurality of rows of the array of memory cells simultaneously wherein the plurality of rows is less than the full compliment of rows of the array of memory cells.

10. The column block enable signals in accordance with claim 6 wherein the column block enable signals select one column of the array of memory cells when performing an erase cycle.

11. The column block enable signals in accordance with claim 6 wherein the column block enable signals select all columns of the array of memory cells simultaneously when performing an erase cycle.

12. The column block enable signals in accordance with claim 6 wherein the column block enable signals select a plurality of columns of the array of memory cells simultaneously wherein the plurality of columns is less than the full compliment of columns of the array of memory cells.

13. The array of memory cells in accordance with claim 1 wherein the array of memory cells is 1024 memory words.

14. The array of memory cells in accordance with claim 13 wherein the array of memory cells is configured in 64 addressable rows and 16 addressable columns.

15. The array of memory cells in accordance with claim 14 wherein each row is configured in 16 memory words.

16. The array of memory cells in accordance with claim 15 wherein each memory word is configured in 14 bits.

17. The array of memory cells in accordance with claim 1 wherein the array of memory cells is either one of 512, 2048, 4096, 8192, 16384, 32768 memory words.

* * * * *